(12) United States Patent
Chen et al.

(10) Patent No.: US 8,111,404 B2
(45) Date of Patent: Feb. 7, 2012

(54) METHOD FOR DETERMINING THE DYNAMIC RANGE OF VOLUME HOLOGRAPHIC

(75) Inventors: Cheng-Fu Chen, Yangmei Township, Taoyuan County (TW); Chien-Chou Chen, Taipei (TW); Yu-Fong Tseng, Taoyuan (TW)

(73) Assignee: Chung Yuan Christian University, Jhong Li, Taoyuan County (TW)

( * ) Notice: Subject to any disclaimer, the term of this patent is extended or adjusted under 35 U.S.C. 154(b) by 267 days.

(21) Appl. No.: 12/616,262

(22) Filed: Nov. 11, 2009

(65) Prior Publication Data

US 2010/0123902 A1 May 20, 2010

Related U.S. Application Data

(60) Provisional application No. 61/114,500, filed on Nov. 14, 2008.

(51) Int. Cl.
*G01B 9/02* (2006.01)

(52) U.S. Cl. ......................... 356/521; 356/457

(58) Field of Classification Search .................. 356/457, 356/521
See application file for complete search history.

(56) References Cited

U.S. PATENT DOCUMENTS

2008/0008076 A1\* 1/2008 Raguin et al. ................. 369/103

OTHER PUBLICATIONS

System metric for holographic memory systems, Mok et al, Optics Letters, vol. 21, No. 12, Jun. 15th, 1996: Mok et al.\*

\* cited by examiner

*Primary Examiner* — Tarifur Chowdhury
*Assistant Examiner* — Jonathon Cook
(74) *Attorney, Agent, or Firm* — Alan Kamrath; Kamrath IP Lawfirm, PA (57) ABSTRACT

A method for measuring a saturated photorefractive index and a recording time constant to correct the precision includes measuring the diffraction efficiency as a function of time for both phase matching and phase mismatching. The saturated photorefractive index and the recording time constant are verified by substitution into a theoretical formula derived from the Coupled Wave Theory. Thus, the method allows a precise determination of the dynamic range of volume holographic memories and thus their storage capacities. The same procedure can also apply to photopolymers.

4 Claims, 7 Drawing Sheets

METHOD FOR DETERMINING THE DYNAMIC RANGE OF VOLUME HOLOGRAPHIC

CROSS REFERENCE TO RELATED APPLICATION

The present application claims benefit of U.S. application Ser. No. 61/114,500 filed on Nov. 14, 2008.

BACKGROUND OF THE INVENTION

1. Field of the Invention

The present invention is generally pertinent to a method for determining a storage capacity of a volume holographic material including photorefractive crystals and photopolymers and, more particularly, to a method for precisely determining a saturated photorefractive index and a recording time constant for transmission gratings of volume holographic material, and hence determining a dynamic range of the material. The storage capacity is proportional to the dynamic range; therefore, the dynamic range is an indicator for storage capacity.

2. Description of the Background

The volume holographic memory constructed by using photorefractive crystals, photopolymers, etc. is known to be an efficient approach for high capacity data storage and retrieval. The storage capacity is related to the dynamic range (M/#) of the material, which is proportional to the ratio of the saturated photorefractive index to the recording time constant (or half-growth time) $\tau_r$. In an approach, measurement of the storage capacity is accomplished by computing the slope from the temporal trace of the square root of diffraction efficiency near the onset of recording. This approach is based on a result from the Coupled Wave Theory, which describes the diffraction efficiency as a function of time according to $$\eta = \sin^2 \frac{\pi \Delta n_{sat}(1 - e^{-t/\tau_r})L}{\lambda \cos\theta}$$

where $\Delta n_{sat}$ is the saturated photorefractive index (in the case of photopolymer it will be light-induced saturated incremental index), $\theta$ is the Bragg angle, L is the interaction length, and $\lambda$ is the wavelength of the incident light. When the argument of the sine function is very small (which will occur if the ratio $t/\tau_r$ is sufficiently small), the slope of the temporal trace of the square root of diffraction efficiency will yield the ratio of the saturated photorefractive index to the recording time constant. However, without the knowledge of the recording time constant, one cannot make a proper choice of the time limit for the temporal trace to end. An improper choice of this time limit can amount to a 15% error of this value. The prior art have reported several ways to quantify the saturated photorefractive index of the reflection grating and the transmission grating in LiNbO$_3$ but not the recording time constant measurement.

There are at least three techniques reported in the literature for such a measurement. The first technique uses optical path compensation (referred to as the null method) for measuring the birefringence change and hence the space charge field. During the course of the experiment, it takes a certain amount of time to establish the null measurement in order to collect each data point. Therefore, this technique is not a real-time measurement. This method is typically used to measure the change of the photorefractive index of the size of a laser spot inside the photorefractive crystal. It is impossible to use this method to measure the change of the photorefractive index of a region of an interference fringe (whose cross section is on the order of μm). Furthermore, this method requires using apparently identical two photorefractive crystals, and the precision is questionable due to the uncertainty of the equivalence of the photorefractive crystals.

The second technique uses a third beam as a probe to measure the diffraction efficiency from the refractive index grating. This technique requires knowledge of the interaction length, which in most calculations is usually approximated by the photorefractive crystal thickness. This technique, as employed in the prior art, measures the dynamic range (M/#) by using the method described in line 20 to line 23 in page 1, and therefore can not precisely measure the interaction length, the saturated photorefractive index, and the recording time constant as opposed to what is being disclosed in this invention. The third technique measures the energy transfer between beams from a two-beam coupling experiment. It requires a measurement of the relative phase shift in order to complete the calculation of the coupling coefficient, and hence the index amplitude of the grating at any given moment. This technique is less direct than the two previous methods and can't measure the saturated photorefractive index.

Thus there exists a need for a method to more precisely determine the dynamic range of volume holographic memories.

SUMMARY OF THE INVENTION

It is an object of the present invention to provide a method for measuring the recording time constant using a graphical method for determining the recording time constant of a photorefractive crystal or photopolymer.

It is another object of the present invention to provide a method for measuring the saturated photorefractive index of the photorefractive crystal or the saturated light-induced incremental index which uses the recording time constant measurement and all necessary calculations associated with the method.

The method according to the preferred teachings of the present invention determines the saturated photorefractive index of the photorefractive crystal by measuring the diffraction efficiency of the grating formed by using the interference of two laser beams. The method according to the preferred teachings of the present invention includes a method of measuring an interaction length. First, a grating is created in a photorefractive material by using an interference of two expanded and collimated writing laser beams. A third expanded and collimated laser beam is then used to read the grating to obtain the diffraction efficiency as a function of time. First, the interaction length is measured using a set of diffraction measurements under both the Bragg phase-matching condition and the phase-mismatching condition. The measurement and analysis show that a correct interaction length will only result in about 1-2% error in precision. Second, the saturated photorefractive index and the recording time constant are computed using the data plot of diffraction efficiency as a function of time derived from the phase-matching measurement. The saturated photorefractive index and the recording time constant were then substituted back into the theoretical formula derived from the Coupled Wave Theory to plot the diffraction efficiency as a function of time. The result is consistent with the experimental data. Furthermore, the saturated photorefractive index computed by the method according to the preferred teachings of the present invention is comparable to the value derived from the non-diffraction efficiency methods, i.e., the first method mentioned in the background section. The results of the two methods are consistent with each other.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

DETAILED DESCRIPTION OF THE INVENTION

Using the measurement of diffraction efficiency for both phase matching and phase mismatching allows the determination of the saturated photorefractive index and the recording time constant for transmission gratings. The first portion of this technique, i.e., the measurement of an interaction length will be summarized as follows. According to the Coupled Mode Theory, the diffraction efficiency of a transmission grating for the phase matching case is given as:

$$\eta = \sin^2 \kappa L = \sin^2 \frac{\pi \Delta n(t)}{\lambda \cos \theta_B} L, \quad (1)$$

where $\kappa$ is the coupling constant and is given by:

$$\kappa = \frac{\pi \Delta n(t)}{\lambda \cos \theta_B}, \quad (2)$$

in which $\theta_B$ is the Bragg angle, L is the interaction length, and $\lambda$ is the wavelength of the incident light. The amplitude of this photorefractive index grating grows exponentially as a function of time similar to that of charging a capacitor. Thus, one can rewrite Eq. (1) as follows:

$$\eta = \sin^2 \frac{\pi \Delta n_{sat}(1 - e^{-t/\tau_r})}{\lambda \cos \theta_B} L \quad (3)$$

where $\tau_r$ is the recording time constant. If one measures the diffraction efficiency as a function of time while the grating is being built, the maxima occur when $\kappa L = (N+\frac{1}{2})\pi$, while the minima occur when $\kappa L = N\pi$, then the photorefractive index can be written as:

$$\Delta n = N' \cdot \frac{\lambda \cos \theta_B}{L}, \quad (4)$$

where N' is either N or N+½ (N being a natural number). Note that N' is a rational number if the diffraction efficiency is at any non-extreme value. Also, if one wants to calculate the photorefractive index $\Delta n_{sat}$ with high precision, one must know the interaction length L, which is often impossible to precisely determine by direct measurement. One can use the phase mismatching measurement to calculate this interaction length as outlined below. If the incident angle is deviated from the Bragg angle by the amount $\Delta\theta$, the diffraction efficiency is determined by using the following equation:

$$\eta = \frac{\kappa^2}{\kappa^2 + \left(\frac{\Delta\alpha}{2}\right)^2} \sin^2\left\{\kappa L\left[1 + \left(\frac{\Delta\alpha}{2K_g}\right)^2\right]^{1/2}\right\}, \quad (5)$$

where $K_g$ is the modulus of the grating vector, and $\Delta\alpha$ is the momentum mismatch equaling to $K_g \Delta\theta$. The diffraction efficiency drops to zero under the following condition:

$$\kappa L\left[1 + \left(\frac{\Delta\alpha}{2\kappa}\right)^2\right]^{1/2} = m\pi, \quad (6)$$

$$m = 1, 2, 3 \ldots$$

There are multiple ms satisfying Eq. (6), but if the measurement is performed right after the first phase matching measurement, then m should be the smallest integer that is larger than the rational number N' at the time when the phase matching measurement is stopped. The interaction length can be calculated using the following equation:

$$L = \frac{(m_2^2 - m_1^2)^{1/2} \lambda}{2n \sin \theta_B (\Delta \theta_2^2 - \Delta \theta_1^2)^{1/2}}, \quad (7)$$

where the two integers $m_1$ and $m_2$ satisfy Eq. (7) and are related to the first and the second angular deviations from the Bragg angle, $\Delta\theta_1$ and $\Delta\theta_2$, respectively (which are the first and the second nulls/zeroes of the corresponding diffraction efficiency curve). The saturated photorefractive index and the recording time constant can be computed using the measurement technique described below and the interaction length given by Eq. (7), and the measurement precision of the photorefractive index to about 1-2% error is achieved.

The present invention discloses a new approach outlined below to calculate the saturated photorefractive index and the recording time constant using the previously described method of calculating the interaction length. First, Eq. (7) is utilized to find the interaction length by performing the phase-matching and phase-mismatching measurement after a grating is created by using an interference of two expanded and collimated writing laser beams. Second, the interaction length found from the first step is substituted into Eq. (1) to compute the photorefractive index at the first maximum (N=½), and at the first minimum (N=1) in the diffraction efficiency $\eta$ vs. time as follows:

$$\Delta n_1(t_1) = \frac{1}{2} \cdot \frac{\lambda \cos\theta_B}{L}, \quad (8)$$

$$\Delta n_2(t_2) = 1 \cdot \frac{\lambda \cos\theta_B}{L}. \quad (9)$$

Assume $t_1$ is the time for the first maximum to occur and $t_2$ is the first minimum to occur (if multiple extremes occur, other extremes can also be used to perform similar calculation outlined here) and since the amplitude of this photorefractive index grating grows exponentially as a function of time similar to that of charging a capacitor, we can write $$\Delta n_1(t_1) = \Delta n_{sat}(1-e^{-t_1/\tau_r}) \quad (10)$$

$$\Delta n_2(t_2) = \Delta n_{sat}(1-e^{-t_2/\tau_r}) \quad (11)$$

Since $\Delta n_{sat}$ in the above two equations must be equal, we can write:

$$\Delta n_1(1-e^{-t_2/\tau_r}) = \Delta n_2(1-e^{-t_1/\tau_r}). \quad (12)$$

The method according to the preferred teachings of the present invention solves the variable $\tau_r$ by using the graphical solution method, as the above equation is a transcendental function. Once $\tau_r$ is solved, we can compute $\Delta n_{sat}$ by using either Eq. (10) or Eq. (11).

Experiment and Computation

Figure 1:
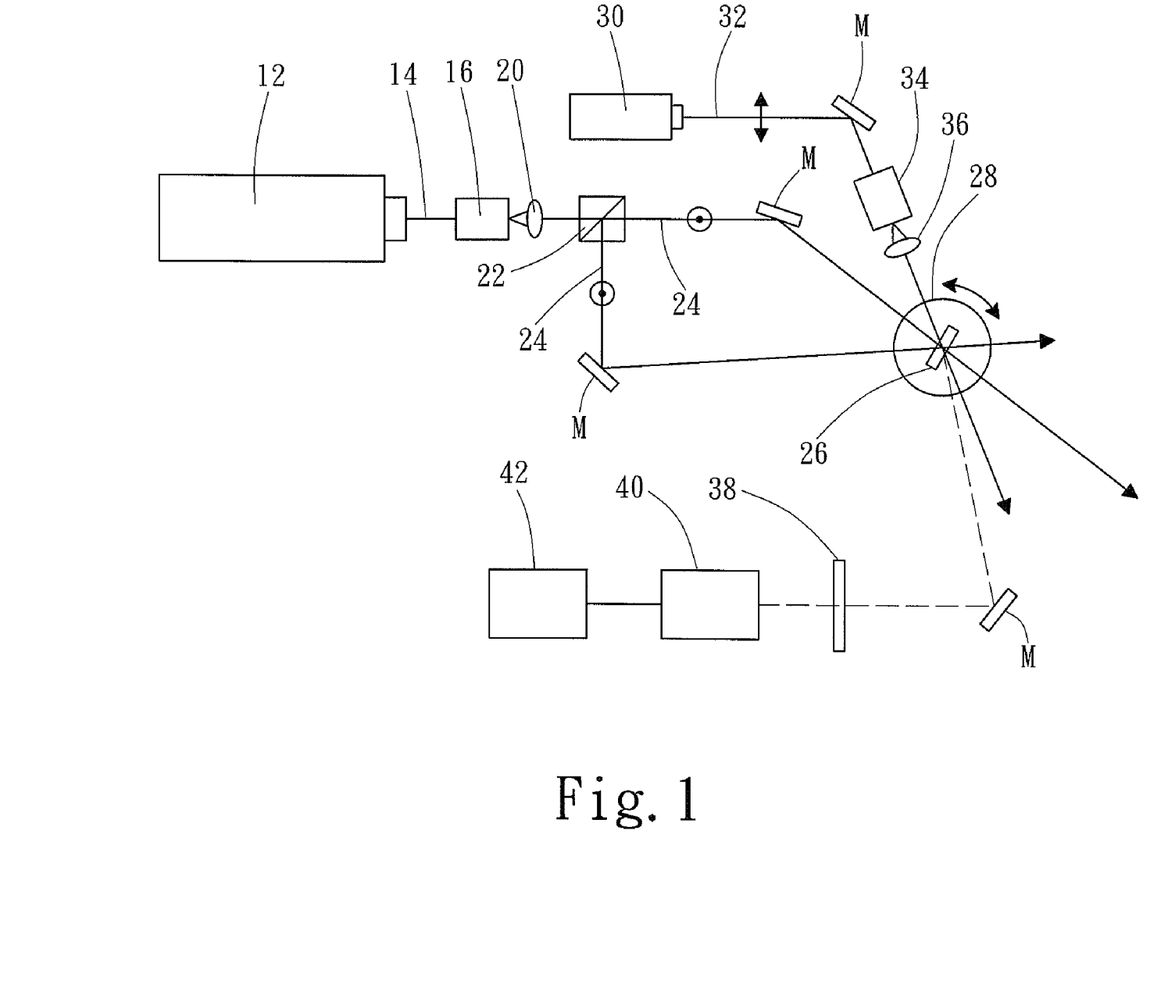
FIG. 1 shows an experimental set-up for measuring the saturated photorefractive index of a grating.
Figure 2:
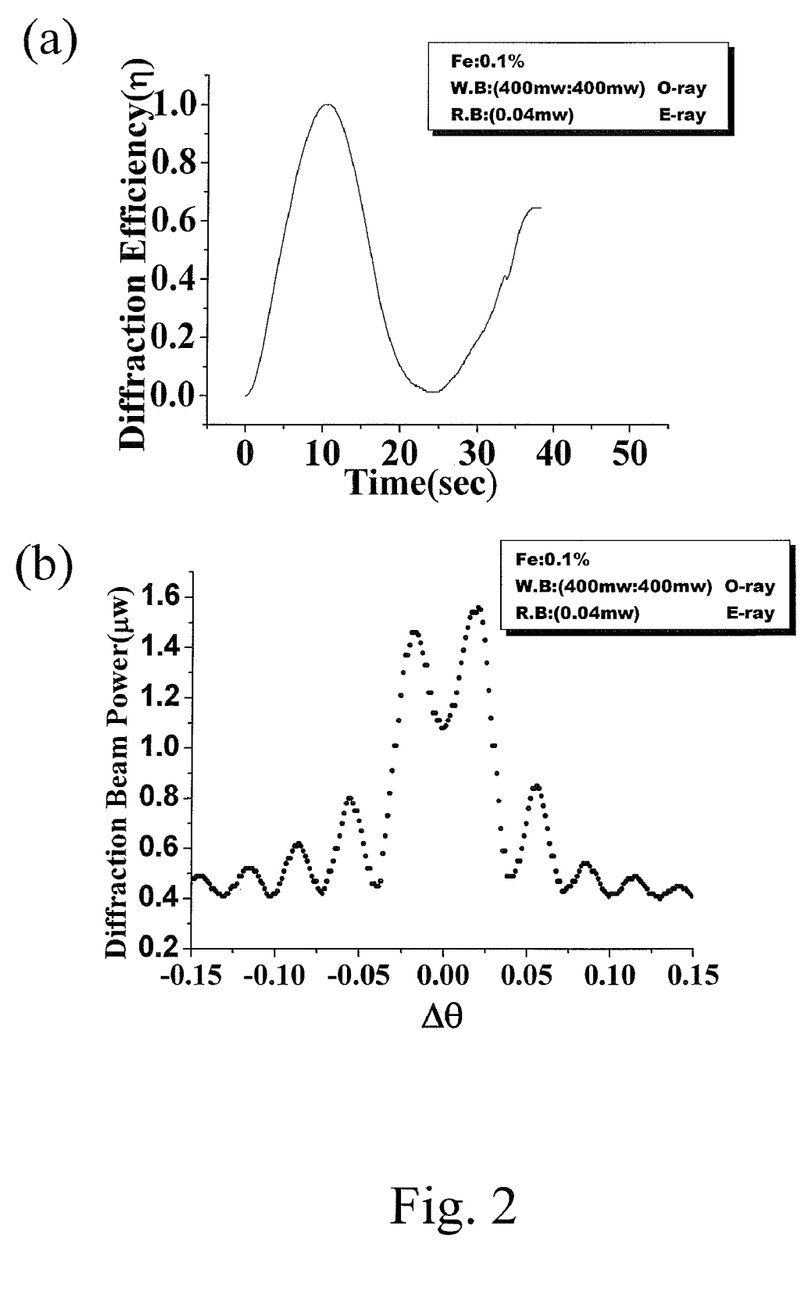
FIG. 2(a) shows diffracted He—Ne laser beam power as a function of time for phase matching measurement from the grating constructed by two interference beams whose intensity ratio was 400 mW:400 mw and intersected at an angle of 30.4 on a 0.1% Fe doped $LiNbO_3$.
FIG. 2(b) shows diffracted beam power vs. Bragg angle deviation for the phase mismatching measurement for the experiment described in Part (a).

Firstly, the volume holographic material includes but not limit to the photorefractive crystal such as $LiNbO_3$, photopolymer, etc. The method according to the preferred teachings of the present invention uses $LiNbO_3$ of photorefractive crystal to explain the art but not limit the scope. FIG. 1 depicts a setup for a phase-matching experiment. Specifically, an Argon laser source 12 emits an Argon laser beam 14 of a wavelength of 514 nm that passes through a spatial filter 16 and an achromatic lens 20 (spatial filter 16 and achromatic lens 20 form a beam expander and a collimator) into a beam splitter 22 where the Argon laser beam 14 is split into two writing laser beams 24. Each writing laser beam 24 is polarized and then reflected by a mirror M into the photorefractive crystal 26 placed on a rotation stage 28, forming an index grating within the crystal 26 (Fe: $LiNbO_3$ of 10 mm×2 mm×10 mm). The two laser beams 24 intersect at an angle of 30.4 outside the crystal 26. The fringe period of this geometrical configuration turns out to be $9.8\times10^{-7}$ m. In this setup, the Argon laser beam 14 is spatially-filtered (using a 5X object lens) and is then collimated with the achromatic lens 20 with a focal length of 12 cm. The diameter of a typical laser spot is 11 mm (as opposed the spot diameter of 1.8 mm without filtering and collimation). In order to avoid beam fanning, the method according to the preferred teachings of the present invention uses ordinary rays to form the grating. While the grating is being constructed, a He—Ne laser source 30 emits a much weaker He—Ne laser beam 32 with an intensity of 1.27 mW/cm² in extraordinary ray polarization to probe the grating. The choice of different different light polarization arrangements, if it is workable, will be within the skill of the art after the following teachings of the present invention have been read and understood. The diameter of the illuminating area is about 6 mm. The He—Ne laser beam 32 is reflected by a mirror M and then passes through a spatial filter 34 and an achromatic lens 36 (spatial filter 34 and achromatic lens 36 form a beam expander and a collimator) into the crystal 26. The method according to the preferred teaching of the present invention uses a Newport Model 818-SL detector 40 and a Newport Model 1825-C power meter coupled to the Argon laser source 12 and the He—Ne laser source 30. The refractive beam is reflected by another mirror M and then passes through a long pass filter 38 of a cut-off wavelength of 590 nm. Then, the reflected beam is detected by the detector 40 coupled to a computer 42 that receives power output from the power meter. The result is shown in FIG. 2(a), which displays the diffraction efficiency as a function of time. The writing beams were turned off, and the phase-mismatching experiment commenced by rotating the photorefractive crystal and measuring its efficiency as a function of angle mismatch. A step motor that has a smallest step of 0.005° controlled the rotation stage 28. The result is shown in FIG. 2(b). The first two minima adjacent to each other were selected, and Eq. (7) was utilized to calculate the interaction length L.

Next, the method according to the preferred teachings of the present invention calculates the index amplitude $\Delta n$ for the first maximum and the first minimum in FIG. 2(a), using Eq. (8) and Eq. (9) separately. The two sides of Eq. (12) are plotted in order to find the recording time constant $\tau_r$ at their intersection, which turns out to be $\tau_r$=56.6 seconds. Thus, a saturated photorefractive index for the grating of the $LiNbO_3$ crystal of $9.0\times10^{-4}\pm0.2\times10^{-4}$ can be obtained after calculation. Table 1 summarizes all the calculation involved and the method used for each step.

The extraordinary refractive index of Lithium Niobate is very sensitive to temperature. Due to the high intensity of the laser beams, heat may be generated inside the crystal and thus the measured value of $\Delta n_1$ and $\Delta n_2$ may bear the temperature effect. The assumption made in the previous discussion, however, is that the exponential growth of the amplitude of the index grating is solely attributed to photorefraction. Thus, the temperature effect of the measured value of $\Delta n_1$ and $\Delta n_2$ must be removed in order to precisely account for the saturated amplitude of index which is attributed to photorefraction only. It was found that the measured result in the $LiNbO_3$ of photorefractive crystal was not influenced by the temperature effect. However, in a case that the temperature effect can not be neglected in a portion of the volume holographic material, the method according to the preferred teachings of the present invention described below can be utilized to correct the influence due to the temperature effect.

TABLE 1

| Quantity | Value | Method |
|---|---|---|
| Beam Power Ratio | 400 mW:400 mW | |
| Writing beam wavelength | 514.5 nm | |
| Writing beam refractive index | 2.34 | |
| Reading beam wavelength | 632.8 nm | |
| Reading beam refractive index | 2.21 | |
| Half Angle(outside crystal) | 15.2° | |
| Bragg angle $\theta_B$ for the writing beam | 6.43° | $\theta_B = \sin^{-1}(\sin 15.2°/2.34)$ |
| Grating width $\Lambda$ | $9.81 \times 10^{-7}$ m | $\Lambda = \lambda/(2 \times 2.34 \sin\theta_B)$ |
| Grating vector Kg | $6.41 \times 10^6$ m$^{-1}$ | $Kg = 2\pi/\Lambda$ |
| Bragg angle $\theta B$ for the reading beam | 8.40° | |
| 1st Zero in Phase Mismatching | $M_1 = 2, \Delta\theta_1 = 0.0380$ | |
| 2nd Zero in Phase Mismatching | $M_2 = 3, \Delta\theta_2 = 0.0720$ | |
| Interaction Length | $2.05 \times 10^{-3} \pm 0.05 \times 10^{-3}$ m | Eq. 7 |
| $\Delta n$ for the First Maximum in the Phase Matching Curve ($\eta$ v.s. time) | $1.52 \times 10^{-4} \pm 0.03 \times 10^{-4}$ | Eq. 8 |
| $\Delta n$ for the First Minimum in the Phase Matching Curve ($\eta$ v.s. time) | $3.05 \times 10^{-4} \pm 0.03 \times 10^{-4}$ | Eq. 9 |
| Half Grating Growth Time | 56.6 sec | Eq. 12 |
| $\Delta n$ Calculated via Phase Matching with temperature correction | $9.0 \times 10^{-4} \pm 0.2 \times 10^{-4}$ | Eq. 10, Eq. 15 |

First, if the grating vector is arranged, such as along the c-axis of the crystal, then the measured photorefractive index at time t can be written as:

$$\Delta n_m(t) = -\frac{1}{2}n_e^3(t, T)\gamma_{33}E_1(t) \quad (13)$$

where $E_1$ is the space charge field amplitude generated by the photorefraction effect, and temperature T is a function of laser exposure time t and the laser light intensity I. The correct value of $\Delta n_1$ and $\Delta n_2$ (which will be denoted as $\Delta n_c$ generically in the following two equations) in Eq. (10) and Eq. (11) must be only those attributed to the extraordinary index at t=0, since they do not depend on the temperature. We can write an equation similar to Eq. (13) for $\Delta n_c$ as follows:

$$\Delta n_c(t) = -\frac{1}{2}n_e^3(t = 0, T)\gamma_{33}E_1(t) \quad (14)$$

Using Eq. (13) and Eq. (14), we can derive the relation between $\Delta n_c$ and $\Delta n_m$ as follows:

$$\Delta n_c(t) = \Delta n_m(t) \cdot \frac{n_e^3(t = 0)}{n_e^3(t)} \quad (15)$$

$$= \Delta n_m(t) \cdot \frac{n_e^3(t = 0)}{[n_e(t = 0) + \Delta n_e]^3}$$

Figure 3:
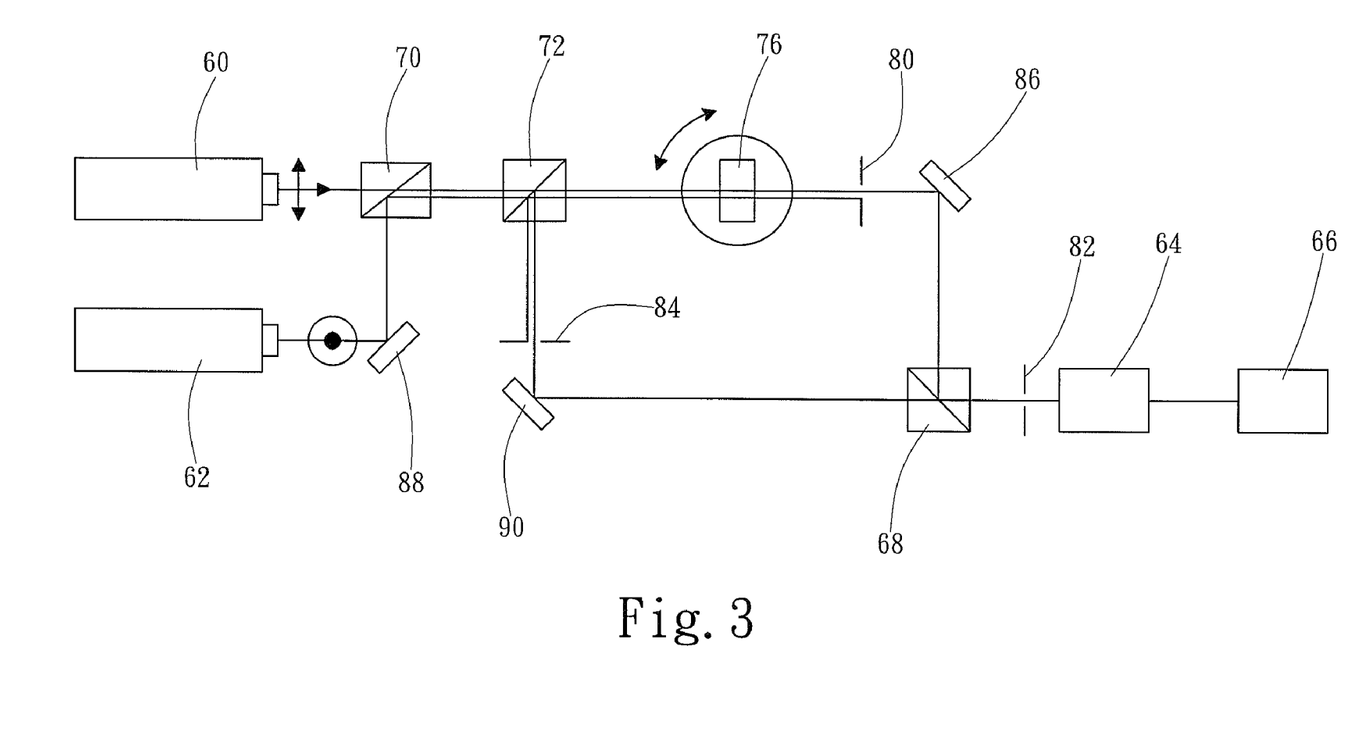
FIG. 3 shows a Mach-Zender Interferometer used in measuring the refractive index due to laser heating.

From the above equation, we can conclude that in order to obtain $\Delta n_c(t)$, we have to measure the extraordinary refractive index at room temperature $n_e$ and the additional refractive index increase $\Delta n_e$ due to the effect of temperature. These two quantities can be measured by using the following procedure. Specifically, the room temperature $n_e$ can be measured by using a Mach-Zender interferometer as shown in FIG. 3, while rotating the crystal in order to observe the fringe changes after the interferometer is set up. The photorefractive index can be calculated using the following equation:

$$n\Delta d(t) = \Delta m(t)\lambda \quad (16)$$

Reference number 60 denotes a He—Ne laser source. Reference number 62 denotes an Argon laser source. Reference number 64 denotes a detector. Reference number 66 denotes a computer. Reference numbers 68, 70, and 72 denote beam splitters. Reference number 76 denotes a crystal. Reference number 80, 82, and 84 denote irises. Reference number 86, 88, and 90 denote mirrors. Operation of the Mach-Zender interferometer is a well known skill and therefore not described in detail to avoid redundancy.

Figure 4:
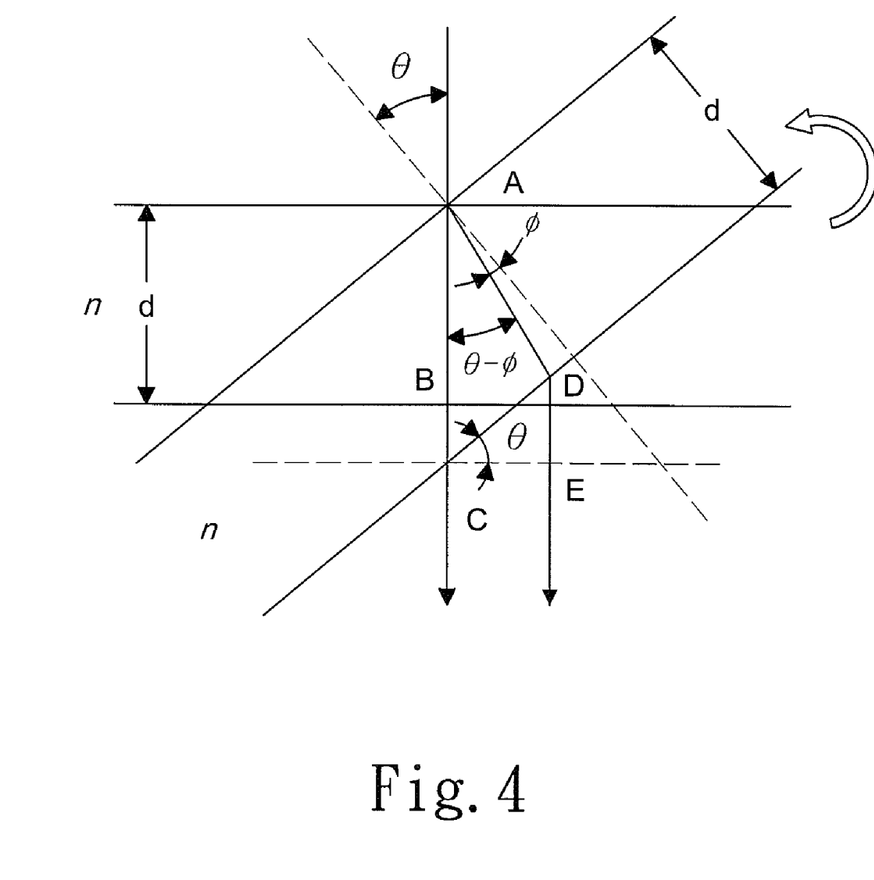
FIG. 4 shows the geometrical considerations for calculating the refractive index of the crystal in one of the arms in the Mach-Zender Interferometer.

With reference to actual calculation of Eq. (16), by inspecting the geometry illustrated in FIG. 4, we conclude that the room temperature refractive index can be obtained from the following formula:

$$n = \frac{(1-\cos\theta)\left(d - \frac{\lambda\Delta m}{2}\right)}{d(1-\cos\theta) - \lambda\Delta m} \quad (17)$$

Figure 5:
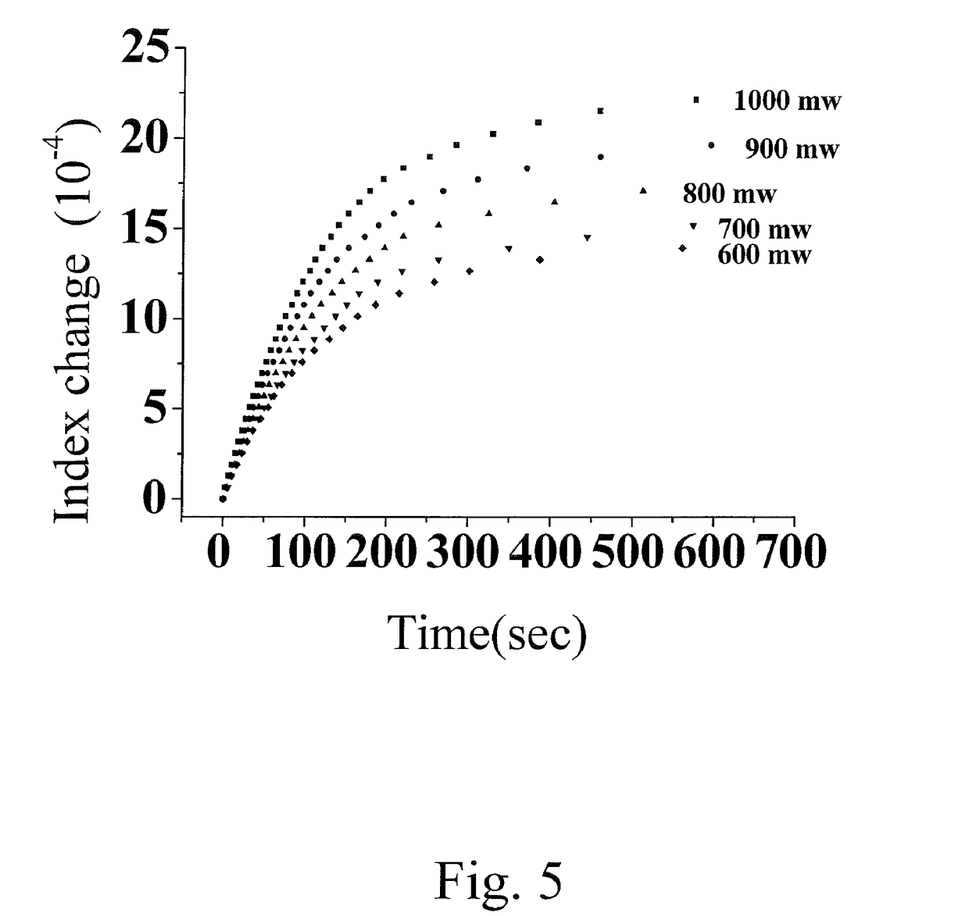
FIG. 5 shows the photorefractive index amplitude of the crystal as a function of time after the crystal is exposed to laser heating for various incident powers.
Figure 6:
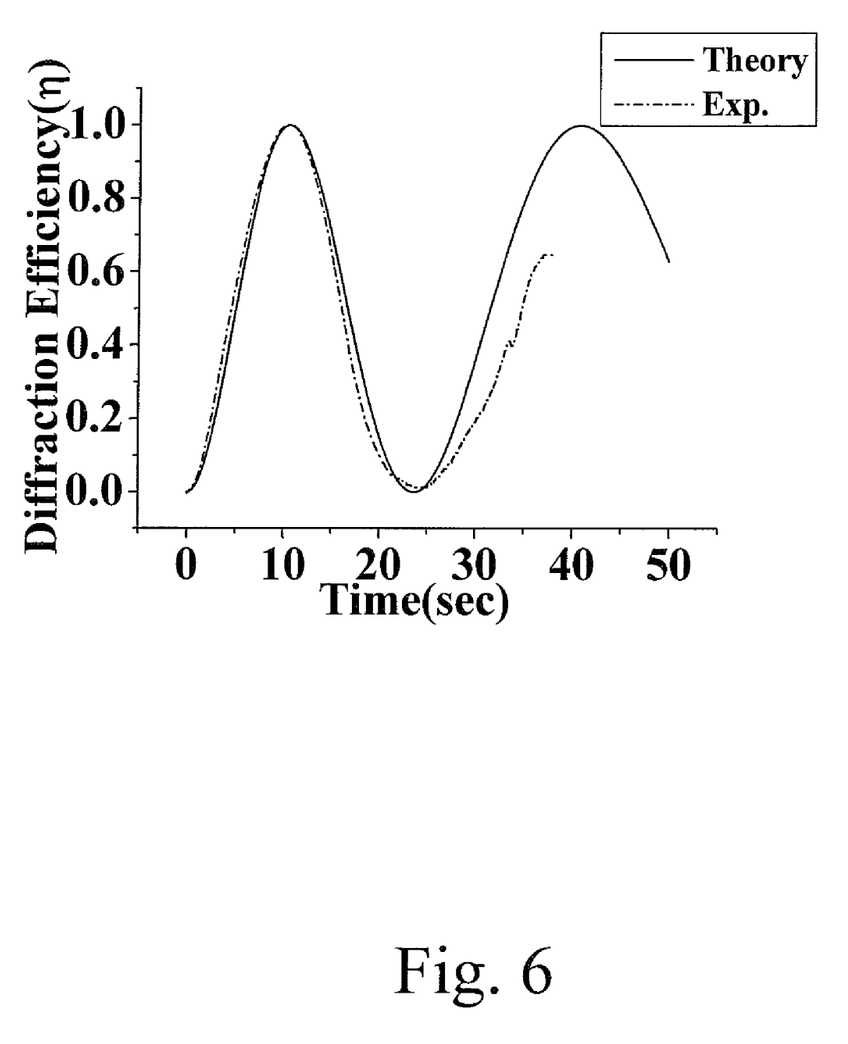
FIG. 6 shows a diffracted beam power plotted as a function of time for both experimental and calculated results, which overlaps at least on the first maximum and the first minimum.
Figure 7:
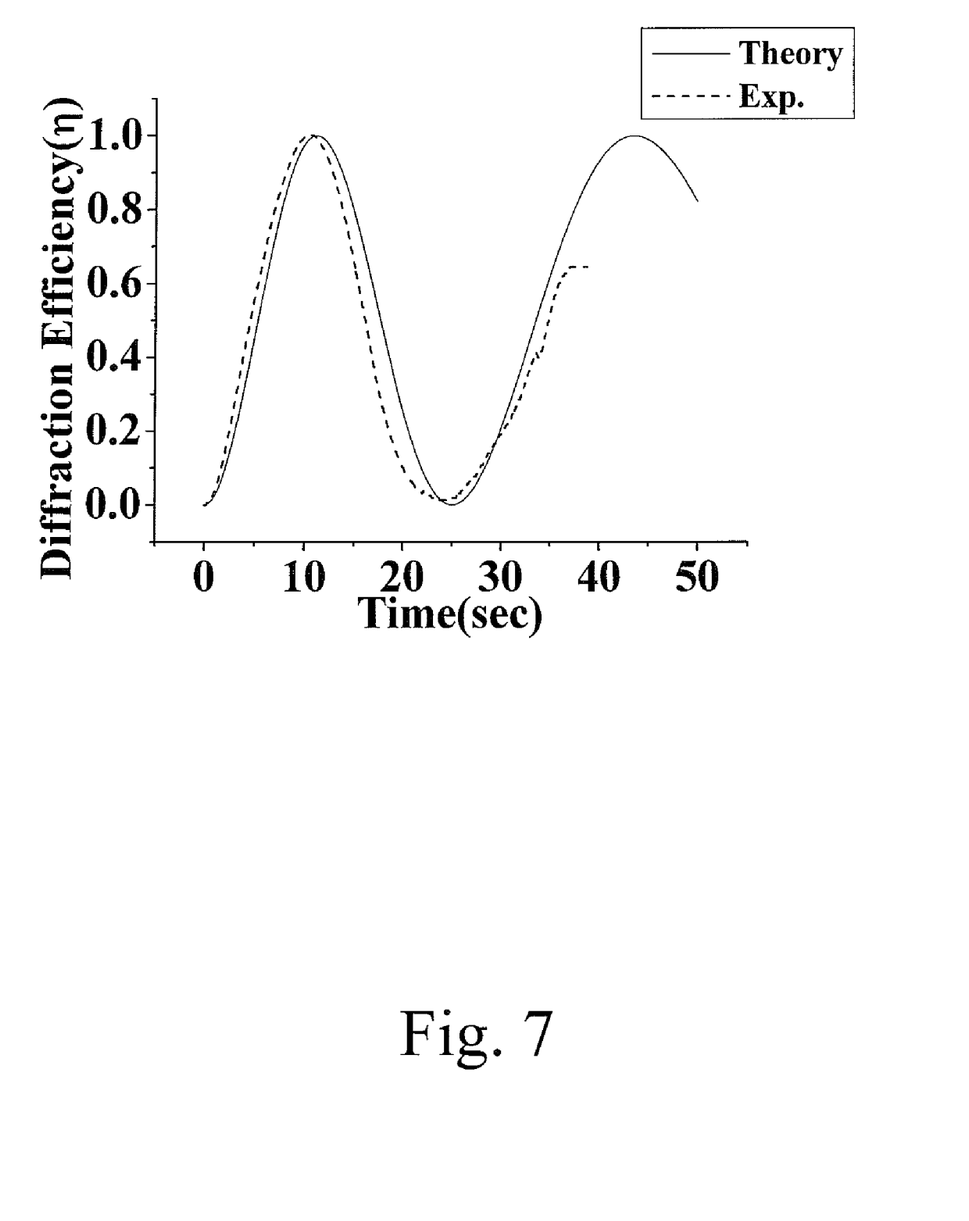
FIG. 7 shows a diffracted beam power plotted as a function of time for both experimental and calculated results, which does not overlap at least on the first maximum and the first minimum, and the calculated result uses the interaction length approximated by the crystal thickness.

The extraordinary refractive index obtained by using this method is 2.21. Next, the additional refractive index increase $\Delta n_e$, due to the effect of temperature, can also be measured by using the Mach-Zender interferometer shown in FIG. 3, in which the crystal is illuminated by a laser beam. Assuming that $\delta$ is the phase difference between two arms of the interferometer, the light intensity of the interferometer can be written as:

$$I = \frac{1}{2}E_T \cdot E_T^* \quad (18)$$

$$= \frac{1}{8}E_0^2(1 + e^{i\delta})(1 + e^{-i\delta})$$

$$= \frac{1}{4}E_0^2(1 + \cos\delta)$$

where the phase difference $\delta$ varies as a function of time, due to the fact that the refractive index changes as the crystal temperature changes through laser heat absorption. The refractive index amplitude $\Delta n(t)$ can be measured by counting the fringe changes $\Delta m$ via the following formula:

$$\Delta n(t)d = \Delta m(t)\lambda \quad (19)$$

where λ is the light wavelength. The results are plotted in FIG. 5. Thus the additional refractive index increase $\Delta n_e$ due to the temperature effect can be extracted from FIG. 5 and then applied to Eq. (15). The error analysis of this calculation is described as above. The corrected result is shown in Table 1. The diffraction efficiency given by Eq. (3) can be plotted as a function of time in order to compare with its experimental counterpart. The result is shown in FIG. 6, which shows that the two curves overlap completely at least the first maximum and the first minimum. On the other hand, if the crystal thickness is used for the interaction length, and Eq. (3) is plotted again and shown in FIG. 7, it is found that the theoretical prediction and the experimental curve do not overlap. Thus, the method according to the preferred teachings of the present invention utilizes two identical $LiNbO_3$ crystals and the optical path compensation method to find the saturated space charge field 50 kv/cm. Using Eq. (14), they found the saturated photorefractive index is $8.25 \times 10^{-4}$, which is consistent with what we found.

Precision Analysis

It is important to estimate the precision of this measurement in order to understand the limitations of this procedure. First, the precision of the rotation stage on which the crystal was stationed was measured using the following method. As the rotation stage was rotated every 30 degrees along one direction sequentially (the same way the experiment was performed), its precision was measured using a Renishaw Calibration Interferometer System. The standard error is 0.009°. Then, the experiment was repeated with a 5 degree incremental step, and the standard error of these angle readings is 0.002° for the angle outside of the crystal, which corresponds to a precision of 0.001° for the angle inside the crystal. Since a five degree incremental step is the minimal step allowed by the system (our actual measurement step is much smaller than the 5 degree incremental step), the method according to the preferred teachings of the present invention could reasonably state that the upper limit of the standard error for our $\Delta\theta$ reading is 0.001°. Therefore, the precision for each of the first and the second minima in FIG. 2(b) is as follows:

$$m_1=2, \Delta\theta_1=0.038°\pm0.001°. \quad (20)$$

$$m_2=3, \Delta\theta_2=0.072°\pm0.001°. \quad (21)$$

The values of ms in the above two equations follow the explanation after Eq. (7). The above error of the Bragg angle deviation along with the error associated with length measurement is the fundamental error sources of all the error calculations here. Following the principle of error analysis, one can derive the standard error of the saturated photorefractive index for the data presented in FIG. 2(a) and FIG. 2(b). The saturated photorefractive index $\Delta n_{sat}$ is $8.99 \times 10^{-4}$, with a standard error of $0.2 \times 10^{-4}$. After removing the contribution due to laser heating by using Eq. (15), the photorefractive index modulation $\Delta n_{sat}$ becomes $9.0 \times 10^{-4}$ with a standard of error $0.2 \times 10^{-4}$. The uncorrected and corrected value are almost indiscernible within the standard error. Thus, the temperature correction is negligible. Therefore, the precision of $\Delta n_{sat}$ can be stated as $\Delta n_{sat}=9.0 \times 10^{-4} \pm 0.2 \times 10^{-4}$, which is equivalent to about 2% error. Had we chosen the crystal thickness as the interaction length, the saturated photorefractive index would become $9.2 \times 10^{-4}$. The precision error amounts to about 2.6% (obtained by retaining one more effective digit in all intermediate results through out all calculations).

After saturated photorefractive index $\Delta n_{sat}$ and the recording time constant $\tau_r$ are obtained, the dynamic range (M/#) can be determined by using the following equation:

$$M/\# = \left(\frac{A_o}{\tau_x}\right)\tau_e$$

where $$A_o = \frac{\pi \Delta n_{sat} L}{\lambda \cos\theta}$$

where $\tau_e$ is the grating erasure time constant which is needed to be calculated in an in-situ application of the crystal.

CONCLUSIONS

In conclusion, the method according to the preferred teachings of the present invention has successfully used an expanded-and-collimated beam to perform the diffraction measurement from photorefractive gratings and have shown the experimental results follow the prediction of Coupled Wave Theory very well. The method according to the preferred teachings of the present invention presents a new approach for measuring the saturated photorefractive index $\Delta n_{sat}$ of a photorefractive index grating with a precision of about 2% error. The method according to the preferred teachings of the present invention is able to quantify the dynamic range (M/#) for those crystals or material to which the method is applicable. Comparing this quantitative measurement photorefractive index with various theoretical predictions, the method according to the preferred teachings of present invention should be able to validate these models. When photorefractive materials become commercial commodities, the method according to the preferred teachings of the present invention will provide a way to rank the photorefractive-related properties of the photorefractive materials in order to differentiate amongst various photorefractive materials.

It can be appreciated that changes in applicable objects to be measured, light wave lengths, laser light sources, angles of interference beams, light detecting instruments and techniques, differing polarization combinations, light expanding techniques, collimating techniques or more precise parallel light techniques, and other auxiliary optical techniques will be within the skill of the art after the above teachings of the present invention have been read and understood.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

The invention claimed is:

1. A method for determining a dynamic range of a volume holographic memory of a photorefractive material comprising:
   creating a grating in the volume holographic material using an interference of two expanded and collimated writing laser beams;
   plotting a first data curve of measurements of a diffraction efficiency as a function of time of the grating by using an expanded and collimated laser beam under a Bragg phase-matching condition;
   plotting a second data curve of measurements of a diffraction efficiency as a function of Bragg angle mismatch under a Bragg phase-mismatching condition;

determining an interaction length of the volume holographic material using the second data curve of measurements of the diffraction efficiency derived from the Bragg phase-mismatching condition;

computing a recording time constant of the volume holographic material using the interaction length and the first data curve of measurements of the diffraction efficiency derived from the Bragg phase-matching condition; and computing a saturated photorefractive index of the volume holographic material using the recording time constant of the volume holographic material and two data points, including diffraction efficiency and its corresponding time, in the first data curve of measurements derived from the Bragg phase-matching condition.

2. The method as claimed in claim 1, with determining the interaction length of the volume holographic material including determination of the interaction length of the volume holographic material by creating gratings using the two expanded and collimated writing laser beams, reading a diffraction of the grating using the expanded and collimated laser beam, and using a first equation below:

$$L = \frac{(m_2^2 - m_1^2)^{1/2} \lambda}{2n\sin\theta_B (\Delta\theta_2^2 - \Delta\theta_1^2)^{1/2}},$$

where the $\Delta\theta_1$ and $\Delta\theta_2$ are first and second angular deviations from the Bragg angle respectively, and $m_1$ and $m_2$ are two integers related to first and second nulls/zeroes of the diffraction efficiency in the second data curve.

3. The method as claimed in claim 2, with computing the recording time constant including calculating a photorefractive index amplitude for a first maximum and a first minimum of the diffraction efficiency and plotting two sides of a second equation below to find the recording time constant at an intersection of the plotting of the two sides of the second equation:

$$\Delta n_1 (1 - e^{-t2/\tau_r}) = \Delta n_2 (1 - e^{-t1/\tau_r})$$

where $\Delta n$ is a photorefractive index amplitude, and $\tau_r$ is the recording time constant.

4. The method as claimed in claim 3, with computing the saturated photorefractive index ($\Delta n_{sat}$) including computing the saturated photorefractive index by substituting the photorefractive index amplitude and the corresponding time in the first data curve into either of a third or fourth equation below:

$$\Delta n_1(t_1) = \Delta n_{sat}(1 - e^{-t1/\tau_r})$$

$$\Delta n_2(t_2) = \Delta n_{sat}(1 - e^{-t2/\tau_r}).$$

* * * * *